United States Patent
Akiyama et al.

(10) Patent No.: US 7,407,839 B2
(45) Date of Patent: Aug. 5, 2008

(54) METHOD OF MANUFACTURING ACTIVE MATRIX SUBSTRATE WITH HEIGHT CONTROL MEMBER

(75) Inventors: Masahiko Akiyama, Tokyo (JP); Yujiro Hara, Yokohama (JP); Yutaka Onozuka, Yokohama (JP); Tsuyoshi Hioki, Yokohama (JP); Mitsuo Nakajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 489 days.

(21) Appl. No.: 11/179,525

(22) Filed: Jul. 13, 2005

(65) Prior Publication Data
US 2006/0001023 A1    Jan. 5, 2006

Related U.S. Application Data

(62) Division of application No. 10/187,015, filed on Jul. 2, 2002, now Pat. No. 6,936,912.

(30) Foreign Application Priority Data
Jul. 10, 2001    (JP) ............................. 2001-208723

(51) Int. Cl.
*H01L 21/00* (2006.01)
(52) U.S. Cl. ...................... 438/149; 438/455
(58) Field of Classification Search ................. 438/149, 438/455
See application file for complete search history.

(56) References Cited

U.S. PATENT DOCUMENTS

| 5,427,642 | A | 6/1995 | Akiguchi et al. |
|---|---|---|---|
| 6,018,167 | A | 1/2000 | Oota |
| 6,150,668 | A | 11/2000 | Bao et al. |
| 6,559,905 | B1 | 5/2003 | Akiyama |
| 6,828,657 | B2 | 12/2004 | Hara et al. |
| 6,844,978 | B2 | 1/2005 | Harden et al. |
| 6,885,030 | B2 | 4/2005 | Onozuka et al. |
| 2005/0106768 | A1 | 5/2005 | Onozuka et al. |

FOREIGN PATENT DOCUMENTS

| JP | 06-118441 | 4/1994 |
|---|---|---|
| JP | 11-142878 | 5/1999 |
| JP | 2001-7340 | 1/2001 |

OTHER PUBLICATIONS

U.S. Appl. No. 11/179,525, filed Jul. 13, 2005, Akiyama et al.

*Primary Examiner*—Thanh Nguyen
(74) *Attorney, Agent, or Firm*—Oblon, Spivak, McClelland, Maier & Neustadt, P.C.

(57) ABSTRACT

An active matrix substrate comprises a substrate, a plurality of adhesion parts provided on the substrate so as to have substantially the same height, and a plurality of active elements provided on the plurality of adhesion parts, respectively, each of the plurality of adhesion parts including a height control member and an adhesive.

8 Claims, 10 Drawing Sheets

METHOD OF MANUFACTURING ACTIVE MATRIX SUBSTRATE WITH HEIGHT CONTROL MEMBER

CROSS-REFERENCE TO RELATED APPLICATIONS

This application is a divisional of U.S. application Ser. No. 10/187,015, filed Jul. 2, 2002 which issued now U.S. Pat. No. 6,936,912 on Aug. 30, 2005, and is based upon and claims the benefit of priority from the prior Japanese Patent Application No. 2001-208723, filed Jul. 10, 2001, the entire contents of each of which are incorporated herein by reference.

BACKGROUND OF THE INVENTION

1. Field of the Invention

This invention relates to active matrix substrates and a method of manufacturing active matrix substrates.

2. Description of the Related Art

An active matrix display where an active element is provided for each pixel can realize a flat-type display with high picture quality. Of displays of this type, a liquid-crystal display (LCD) that uses liquid crystal as an optical shutter and drives each pixel with an active element, such as a TFT, has been widely used.

A known organic electroluminescence (EL) display is such that EL material capable of emitting red, green, and blue (RGB) light is formed by inkjet techniques and mask deposition techniques to make pixels, and each pixel is driven by an active element, such as a TFT. The organic EL display can also display a full color image on a thin panel screen.

In the prior art, to form the pixel section of such an active matrix flat-type display, each component layer is formed on a glass substrate using vacuum thin layer processes, such as CVD or sputtering techniques. The layers are then subjected to microscopic processing by dry etching or wet etching and by photolithography. These processes are repeated for each of the layers, including a semiconductor layer, an electrode layer made of metal or the like, and an insulating layer. As a result, the number of processes increases, resulting in an increase in the cost.

In the flat-type display, the active elements are formed not on the entire surface of the substrate but on a part of each pixel. Thus, it is a waste of time and labor to form all the active elements provided on the glass substrate. Such a wasteful forming method sets the economical limits to the formation of a large-area display.

In contrast, one known method is such that a plurality of active elements are formed very densely beforehand on an element formation substrate and that they are transferred to an intermediate substrate and further transferred to a display substrate (or a final substrate), and thereafter, passive structures, including interconnections and pixel electrodes, are formed, thereby reducing the cost (for example, refer to Jpn. Pat. Appln. KOKAI Publication No. 2001-7340).

FIG. 1 shows part of the process of transferring active elements from an intermediate substrate to a final substrate in Jpn. Pat. Appln. KOKAI Publication No. 2001-7340. As shown in FIG. 1, on a final substrate 2501, patterned scanning lines 2503, interlayer insulators 2504, patterned signal lines 2502, a planarization layer 2505 are stacked one on top of another in this order. On the planarization layer 2505, an adhesion layer 2506 is provided. In the interlayer insulators 2504 and planarization layer 2505, contact holes for subsequent wiring are made in the areas corresponding to the signal lines 2502 and scanning lines 2503.

At the intermediate substrate 2507, TFTs 2510 are formed via a temporary adhesion layer 2508. The TFTs 2510 are covered with a protective layer 2509. At the bottom of each of the TFTs 2510, an under layer 2511 is provided to protect the TFT.

To transfer the TFTs 2510 from the intermediate substrate 2507 to the final substrate 2501, the TFTs 2510 to be transferred are aligned with the adhesion layer 2506. Then, light is projected through a shading mask 2512 which has an opening only in this area. Then, the adhesion of the temporary adhesion layer 2508 is weakened and the under layer 2511 is bonded to the adhesion layer 2506, thereby performing transfer.

In this method, TFTs 2510 requiring many manufacturing processes are formed on the element formation substrate with a high element density. The TFTs 2510 are transferred once from the element formation substrate to the intermediate substrate 2507. Then, the TFTs 2510 on the intermediate substrate 2507 are further transferred onto the final substrate 2501. At that time, use of a large element formation substrate and a large intermediate substrate 2507 enables TFTs 2510 arranged with a high density to be selected at regular intervals and transferred to the final substrate 2501 by way of the intermediate substrate. Using such a method makes it possible for TFTs 2510 used for many substrates to be formed on a single element formation substrate, which reduces the cost equivalent to the ratio of the TFT density of the element formation substrate to that of the final substrate.

When the TFTs 2510 are transferred to the final substrate 2501 by the method shown in FIG. 1, the TFTs 2510 are pressed against the adhesion layer 2506. In this case, it is difficult to control the force with which the TFTs 2510 are pressed. When the adhesion layer is pressed, the following problem arises: the height of the adhesion layer 2506 spread sideways differs from that of the adhesion layer 2506 not spread or the TFTs 2510 are not in parallel with the final substrate. Since the height of the TFTs 2510 provided on the final substrate 2501 and the angle of the TFTs 2510 with the final substrate 2510 are not controlled, the formation of interconnections after the TFTs 2510 are formed is difficult.

Furthermore, when the TFTS 2510 are pressed against the adhesion layer 2506 for transfer, there is a possibility that the adhesion layer 2506 will spread sideways and the adjacent TFTs 2510 also adhere to the adhesion layer 2506. Therefore, to prevent the adjacent TFTs 2510 from adhering to the adhesion layer 2506 even when the adhesion layer 2506 spreads sideways, the adjacent TFTs 2510 have to be spaced a suitable distance apart from each other. As a result, the number of TFTs 2510 formed on a single element formation substrate decreases, which causes the problem of increasing the cost.

Therefore, there has been a need to realize an active matrix substrate which is capable of controlling the height of active elements from the surface of the final substrate in transferring the active elements and that enables the active elements to be almost parallel with the final substrate even via an adhesion layer, and a method of manufacturing such active matrix substrates.

BRIEF SUMMARY OF THE INVENTION

According to a first aspect of the present invention, there is provided an active matrix substrate comprising a substrate; a plurality of adhesion parts provided on the substrate having substantially the same height, each of the plurality of adhesion parts including a height control member and an adhesive; and a plurality of active elements provided on the plurality of adhesion parts.

According to a second aspect of the present invention, there is provided a method of manufacturing an active matrix substrate, comprising forming a plurality of active elements on a first substrate; forming a plurality of adhesion parts on a second substrate, each of the adhesion parts including an adhesive and a height control member surrounding the adhesive; selectively transferring the plurality of active elements to the second substrate in such a manner that the plurality of active elements adhere to the adhesion parts; and forming interconnections between the plurality of active elements transferred onto the second substrate.

According to a third aspect of the present invention, there is provided a method of manufacturing an active matrix substrate, comprising forming a plurality of active elements on a first substrate; forming a plurality of adhesion parts on a second substrate, each of the plurality of adhesion parts including a plurality of height control members in an adhesive; selectively transferring the plurality of active elements to the second substrate in such a manner that the plurality of active elements adhere to the plurality of adhesion parts; and forming interconnections between the plurality of active elements transferred onto the second substrate.

DETAILED DESCRIPTION OF THE INVENTION

Hereinafter, referring to the accompanying drawings, embodiments of the present invention will be explained.

First Embodiment

Figure 13:
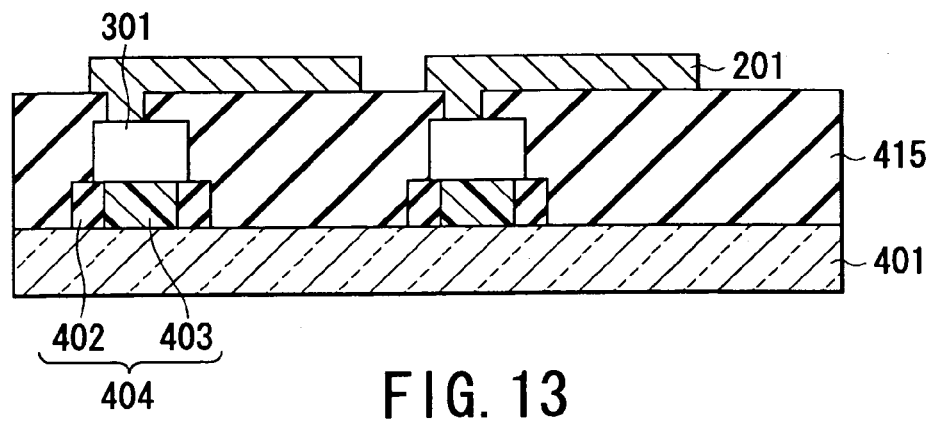

In a first embodiment of the present invention, active elements (hereinafter, referred to as elements) are formed at an element formation substrate (a first substrate) and transferred to an intermediate substrate. Then, they are further transferred to a final substrate (a second substrate) at which a height control member and an adhesive surrounded (enclosed) by the height control member have been formed, thereafter forming interconnections and others, which completes an active matrix substrate. The height control member makes the heights of the adhesion parts at a certain height. A sectional view of a part of an active matrix substrate according to the first embodiment is shown in FIG. 13. The configuration of the active matrix substrate will be explained by reference to FIG. 13.

The active matrix substrate of the first embodiment has adhesion parts 404 provided so as to have practically the same height as that of the final substrate 401 and elements 301 provided on the adhesion parts 404. Each of the adhesion parts 404 includes an adhesive 403 and a height control member 402 provided so as to surround the adhesive 403. A post-transfer insulating layer 415 is provided on the entire surface of each of the elements 301. An opening is made in the post-transfer insulating layer 415 in the area corresponding to the contact section of each element 301. Then, conducting layers and interconnections, such as pixel electrodes 201 to be connected to the elements 301, are formed.

Hereinafter, a method of manufacturing the active matrix substrate will be explained. First, a method of forming elements on an element formation substrate and transferring the elements to an intermediate substrate (a third substrate) will be explained by reference to FIGS. 2 to 4.

Figure 1:
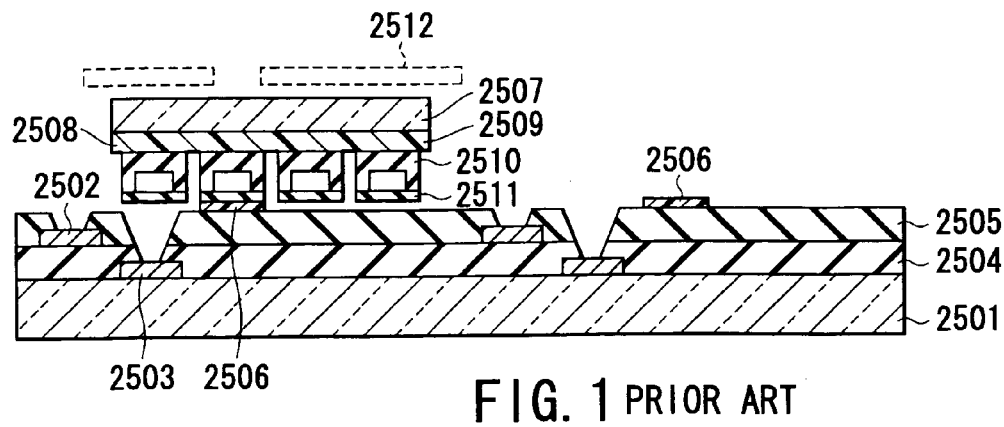
FIG. 1 is a sectional view to help explain the element transferring process in a conventional active matrix substrate manufacturing method.
Figure 2:
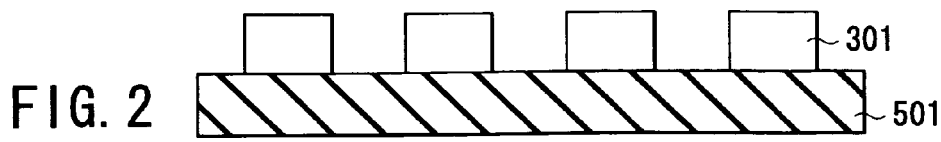
FIG. 2 is a sectional view to help explain the element forming process in an active matrix substrate manufacturing method according to a first embodiment of the present invention.

First, as shown in FIG. 2, elements 301 are formed on an element formation substrate 501. An element 301 may be a single TFT or a circuit composed of a plurality of TFTs. This type of circuit includes an in-pixel memory circuit or a circuit that compensates for variations in the Vth of the driving TFTs in an organic EL display using four or more TFTs.

Figure 3A:
FIG. 3A is a sectional view to help explain the temporary adhesion process for an element formation substrate and an intermediate substrate in the first embodiment.

Next, as shown in FIG. 3A, an optical conversion material 602 is formed in the position corresponding to each element 301 on an intermediate substrate made of a transparent material, such as glass, by using CrOx, or the like, whose back is blackened. Nitto Denko Corporation Riba-alpha, a tackiness agent which foams by heating to decrease in adhesion and is used as a temporary adhesion layer 603, is applied to the intermediate substrate 601 on which the optical conversion material 602 has been formed to a thickness of about 5 to 20 μm. Then, the resulting layer is laminated with the element formation substrate 501 under vacuum.

In this embodiment, infrared rays, visible rays, or the like are projected so as to be absorbed by the optical conversion material 602, which converts the rays of light into heat. As a result, the temporary adhesion layer 603 is heated and therefore foams, which decreases the adhesion. Therefore, what is obtained by patterning a metal layer, made of CrOx, MoTa, MoW, TiOx, or the like, with its light-projected surface being blackened, or a multilayer film of these layers, a carbon layer, a black organic paint layer, or the like may be used as the optical conversion material 602.

Figure 3B:
FIGS. 3B to 3D are sectional views to help explain modifications of the process of FIG. 3A.
Figure 3C:

In a case where a material that comes off when light, such as ultraviolet light, not heat, is projected on the material is used as the temporary adhesion layer 603, what is obtained by patterning a material that converts the wavelength of the projected light into a wavelength that promotes the detachment is used as the optical conversion material 602. When the distance between the elements 301 is fine, the optical conversion material 602 is effective in increasing the selecting resolution of elements 301. When the distance between the elements 301 is coarse and the peel strength of the temporary adhesion layer is properly controlled, the optical conversion material 602 may be eliminated as shown in FIG. 3B As shown in FIG. 3C, the optical conversion material 604 may be formed on the element 301. In that case, an insulating black resin about 1 to 3 μm thick in which pigment has been dispersed may be formed on the top surface of the element as part of a protective layer. Providing the optical conversion material 604 on the element 301 allows the element 301 itself to generate heat. This enables the heating area to be localized, which increases remarkably the resolution in peeling the temporary adhesion layer 603. For example, in a case where the dimension of the element is about 50 μm and the distance between elements is about 5 to 10 μm, the temporary adhesion layer 603 can be peeled without any problem.

Figure 3D:
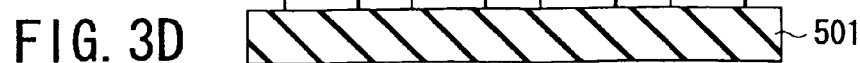

Furthermore, the temporary adhesion layer 603 may adhere to an upper surface of the element 301, as shown in FIG. 3D. When the temporary adhesive layer is a tackiness agent layer formed on the intermediate layer 601 or a tackiness tape, it suffices that the temporary adhesive layer may be pressed to the element 301 to achieve a construction shown in FIG. 3D. The element 301 may include the optical conversion material 604 shown in FIG. 3C.

A sheet-like material which is obtained by applying a tackiness agent that is adhesive and can decrease the tackiness by heat or light to a carrier film may be used as the temporary adhesion layer 603. This material is effective especially in the case where the optical conversion material 604 is provided on the element 301. The reason is that providing the optical conversion material 604 on the element 301 makes it possible to increase the resolution in peeling the temporary adhesion layer 603, even when the carrier film is about 100 μm and the tackiness agent is as thick as about 50 μm.

The optical conversion material 604 provided on the element 301 acts as an opaque layer for the TFT in the element 301 and has the effect of reducing the optical leakage current. All of the protective layer 414 for the element 301 may be made of a black resin. It may be made of a material that is not black but absorbs the projected light and converts it into heat.

The temporary adhesion layer 603 is not limited to the aforementioned material. For instance, Apeazon wax from Apeazon Products Limited, which decreases in viscosity and lowers in adhesion when being heated may be used as the temporary adhesion layer 603.

An organic resin material that achieves adhesion by dispersing ultraviolet-curing resin into a tackiness agent and decreases the adhesion by hardening the network including the tackiness agent when being struck by light may be used as a material whose adhesion decreases, reacting with ultraviolet light. A material whose adhesion decreases with ultraviolet light, such as an acrylic tackiness agent including benzophenone apt to resolve with ultraviolet light, may be used.

Furthermore, a heat-sensitive tackiness agent that reacts with temperature change or adhesive tape may be used as the temporary adhesion layer 603. For example, use of an organic material that varies between the crystalline state and the amorphous state depending on temperature enables the adhesion to be changed as much as one order of magnitude or more. Specifically, Interlimer (a registered trademark of Landec Corporation) from Nitta Corporation may be used. Although the Warm-Off type that comes off at a temperature higher than the switching temperature is easy to use, the Cool-Off type that comes off at a temperature lower than the switching temperature may be used, provided that the processes are designed for this type. Since the transition between the crystalline and amorphous states is reversible, the material can be used a plurality of times.

Not only glass but also a plastic substrate, such as PET or polyolefin, may be used as the intermediate substrate 601. A sheet-like temporary adhesion layer 603 or a tape-like temporary adhesion layer 603 where an adhesive is coated on a carrier film may be sandwiched and laminated between the intermediate substrate 601 and the element formation substrate 501. The temporary adhesion layer 603 may be formed by applying it to the interlayer substrate 601.

Figure 4:
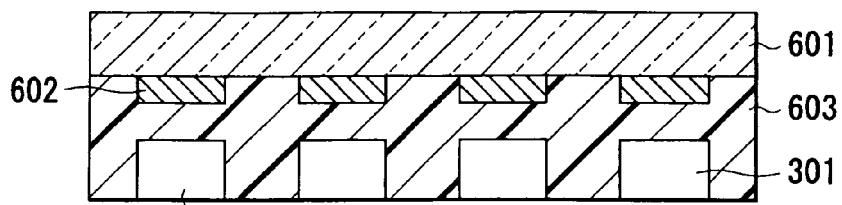
FIG. 4 is a sectional view to help explain the state after the transfer to the intermediate substrate has been completed in the first embodiment.

Next, as shown in FIG. 4, the element formation substrate 501 is removed. In the first embodiment, because the element formation substrate 501 is a glass substrate, it is made thinner by mechanical grinding and then etched with a mixture of hydrofluoric acid and surfactant. At this time, to prevent the under layer from being etched, the etching solution and the material of the under layer are adjusted. For example, when glass is etched with fluoric acid etchant, it is desirable that a fluoric-acid-resistant material, such as AlOx, TaOx, SiNx, or organic resin, should be used as the under layer.

The element formation substrate 501 may be removed not only by grinding or etching but also by making the layer subjected to laser abrasion a part of the under layer or providing this layer under the under layer and projecting a laser beam from the back to peel the substrate 501.

Next, using FIGS. 5 to 13, the process of further transferring the elements transferred to the intermediate substrate to the final substrate and forming interconnections will be explained.

Figure 5:
FIGS. 5 and 6 are sectional views to help explain the process of forming an adhesion part on a final substrate in the first embodiment.

First, as shown in FIG. 5, a height control member 402 is formed in an area in which the elements are to be transferred on the final substrate 401 made of alkali-free glass, soda-lime, plastic, or metal foil. In the first embodiment, the height control member 402 is obtained by applying photosensitive acrylic resin and patterning the resulting layer by photolithography. The height control member 402 looks like a ring (bank) that supports the element and is about 1 to 5 μm higher than the final substrate 401. The internal circumference of the height control member 402 is made smaller than the size of the element.

The height control member may be formed as high as 1 to 20 μm. If the height is set in a higher side, needed are prevention measures for a step breakage of interconnections, which is apt to happen at the later interconnection formation process. However, thick printing of interconnections may overcome this problem when a pixel pitch is coarse.

Figure 6:
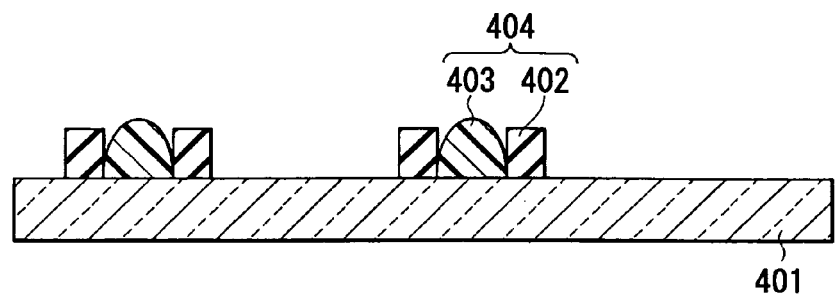
Figure 7:
FIG. 7 is a plan view corresponding to the process of FIG. 6.

Next, as shown in FIG. 6, an adhesive 403 is applied inside the height control member 402 and acts as an adhesion part 404. The adhesive 403 is applied by screen-printing an ultraviolet-curing adhesive. As shown in FIG. 7, since the height control member 402 surrounds the adhesive 403, the adhesive 403 may be liquid when being applied and be dropped suitably and then hardened later.

Note that the adhesive applying method is not limited to screen-printing, but an ink-jet method or a dispensing method may be used to selectively drop the adhesive.

Figure 8:
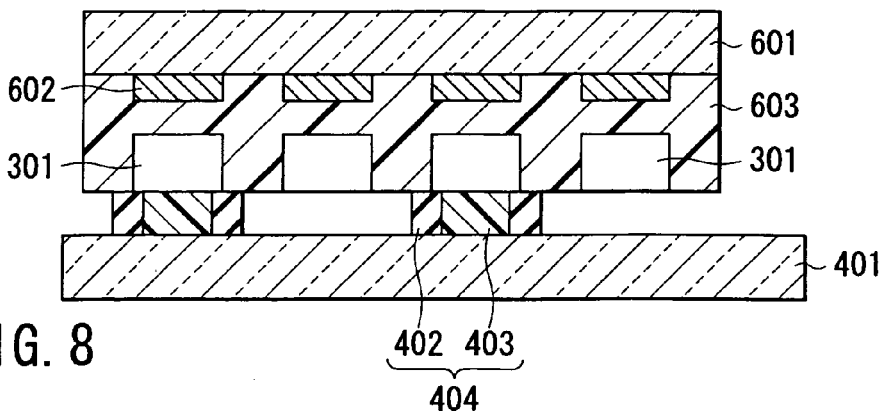
FIGS. 8 and 9 are sectional views to help explain the adhesion process for the intermediate substrate and final substrate in the first embodiment.

Next, as shown in FIG. 8, the intermediate substrate 601 to which the elements 301 have been transferred is aligned with the final substrate 401 on which the adhesion parts 404 have been formed and secured to the latter temporarily. At this time, the intermediate substrate 601 is pressed against the final substrate 401. The height control member 402 has the function of maintaining the height of the adhesion part 404. That is, although the adhesive 403 spreads as a result of being pressed by the bottom surface of the element 301, the existence of the height control member 402 maintains the height, thereby preventing the adhesive 403 from spreading. As a result, the height of the adhesion part 404 is controlled to a specific height of the height control member 402. The amount of the adhesive 403 is large enough to bond the element 301.

The adhesion part 404 is enclosed by the height control member 402, which prevents the part 404 from spreading outward. As a result, a single element 301 is bonded to a single adhesion part 404 without being bonded to the area of an adjacent element 301.

When the intermediate substrate 601 is secured temporarily to the final substrate 401, they may be fixed mechanically or bonded with a suitable temporary fixing adhesive. In the case where fixing is done with the temporary fixing adhesive, it is desirable that the size of the final substrate 401 should be almost the same as that of the intermediate substrate 601 and that the portion fixed with the adhesive should be the peripheral parts of both substrates where there is no element.

Figure 9:
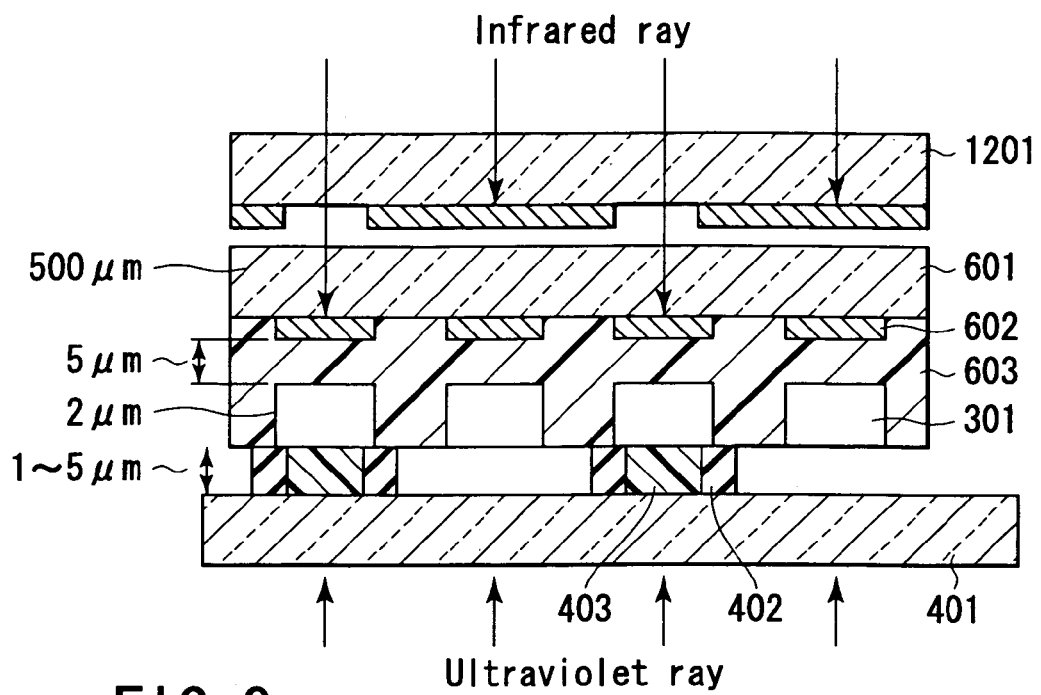

Next, as shown in FIG. 9, infrared rays are projected from under the back of the intermediate substrate 601 so that the elements may be selectively peeled from the intermediate substrate 601, thereby reducing the adhesion of the temporary adhesion layer 603 with which the elements 301 to be transferred are secured. At this time, to prevent infrared rays from striking the elements 301 not to be transferred, a glass mask 1201 is provided, which causes infrared rays to be selectively projected.

When the temporary adhesion layer 603 has been adjusted so that the layer 603 may start to peel at about 90° C., the intensity of the infrared rays is adjusted in such a manner that the optical conversion material 602 of the selected element 301 stays at the peak of at about 100° C. for about two seconds. Then, since infrared rays are hardly projected onto the unselected elements 301 in the periphery, a temperature of about 80° C. or below can be maintained, resulting in almost no decrease in the adhesion of the temporary adhesion layer 603 securing these elements 301.

Figure 10:
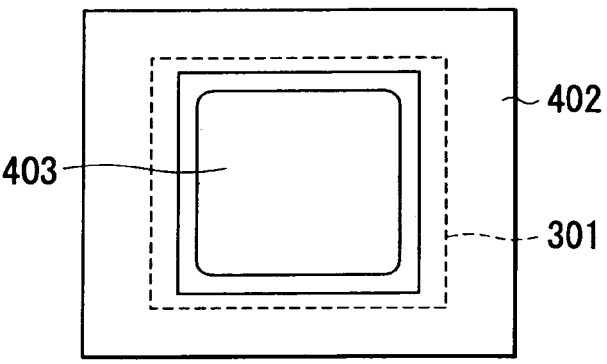
FIG. 10 is a plan view to help explain how the adhesion part and an active element are laid on top of the other in the process of FIG. 9.

At the same time or before the adhesion of the temporary adhesion layer 603 is reduced, ultraviolet rays are projected from under the back of the final substrate 401 to harden the adhesive 403, thereby bonding the element 301 to the final substrate 401. At this time, as shown in FIG. 10, when the periphery (broken-line section) of the element 301 is provided further inside the periphery of the height control member 402 and the adhesive 403 is provided inside the height control member 402, the step produced from the configuration becomes smooth. Therefore, such failures as step breakages or cavities are reduced in subsequent wiring, which improves remarkably the yield of active matrix substrates each of which has as many as more than about one million elements. When the adhesive 403 is of the thermosetting type, the intermediate substrate 601 and final substrate 401 may be sandwiched between heating rollers to heat them locally.

The dimensions of each layer in the configuration of FIG. 9 are shown at left in the figure.

Figure 11:
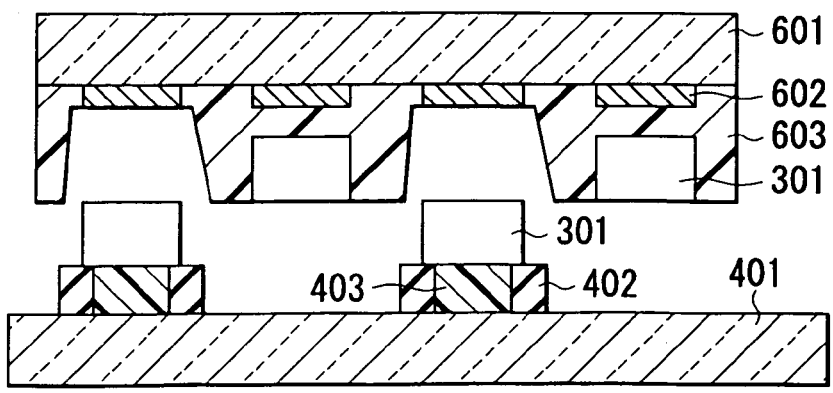
FIG. 11 is a sectional view to help explain the state where the transfer of the active elements to the final substrate has been completed in the first embodiment.

Next, as shown in FIG. 11, in a state where the adhesion of the temporary adhesion layer 603 is weakened and the adhesive 403 is hardened, the intermediate substrate is separated from the final substrate 401, thereby transferring only specific elements 301 to the final substrate 401.

At this time, the adhesive 403 does not adhere to the elements 301 excluding the selected elements 301, with the result that one element 301 adheres to one adhesion part 404 with an almost 100% selectivity. There is no damage to the untransferred elements remaining on the intermediate substrate 601.

Figure 12:
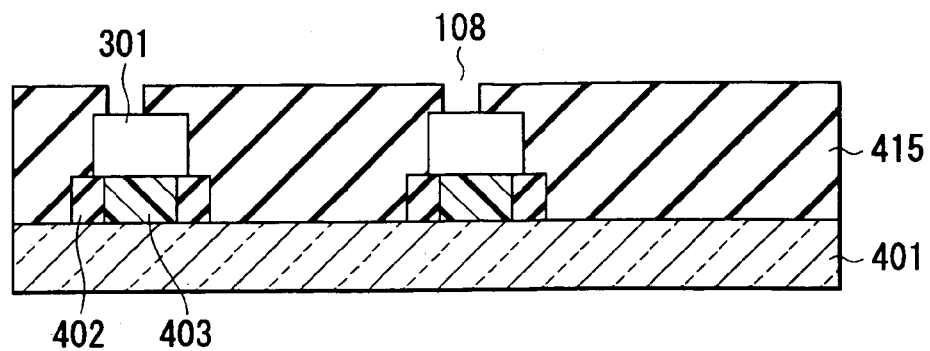
FIGS. 12 and 13 are sectional views to help explain the process of forming interconnections on the final substrate in the first embodiment.

Next, as shown in FIG. 12, on the entire surface of the final substrate 401 to which the elements 301 have been transferred, a post-transfer insulating layer (or post-transfer insulator) 415 is formed using photosensitive acrylic resin. Openings 108 are made in the post-transfer insulator 415 areas corresponding to the contact sections 108 of the elements 301.

Next, as shown in FIG. 13, Al, ITO (Indium Tin Oxide), or the like is formed all over the surface by sputtering techniques and then patterned to form signal lines, scanning lines, and such wires as pixel electrodes. This completes an active matrix substrate. In FIG. 13, only a pixel electrode 201 is shown.

In the first embodiment, the adhesion parts, each including the height control member and the adhesive surrounded by the height control member, are formed on the final substrate. Onto the adhesion parts, the elements are transferred. The adhesive does not go over each height control member because it is surrounded by the height control member of a ring shape. Therefore, this prevents the adhesive from spreading so much that adjacent elements are also bonded to one adhesion part at the same time and transferred to the final substrate.

The height control member may take any shape, provided that it surrounds the adhesive. The shapes of the outside and inside of the height control member are not limited to those in the first embodiment. For instance, they may take the form of a quadrangle, such as a regular square or a rectangle, or a circle, or an oval. Since the height of the height control member in each adhesion part is made almost equal, the height of the element on the final substrate is prevented from differing from one element to another and the surface of the final substrate is always parallel with the elements, which makes subsequent wiring easy.

It is desirable that the height control members and adhesive should be solid when the active matrix substrate is completed. Since the adhesive does not control the height, it may be a solid that has viscosity and further plasticity and elasticity.

Second Embodiment

In a second embodiment of the present invention, a method of manufacturing displays (or active matrix substrates) by an element transferring method according to the first embodiment will be explained. In the second embodiment, two TFTs and a storage capacitor are formed as an element on an element formation substrate. Then, they are transferred to an intermediate substrate and further to a final substrate. Thereafter, inter-connections are formed on the final substrate, thereby forming an EL display.

Figure 14:
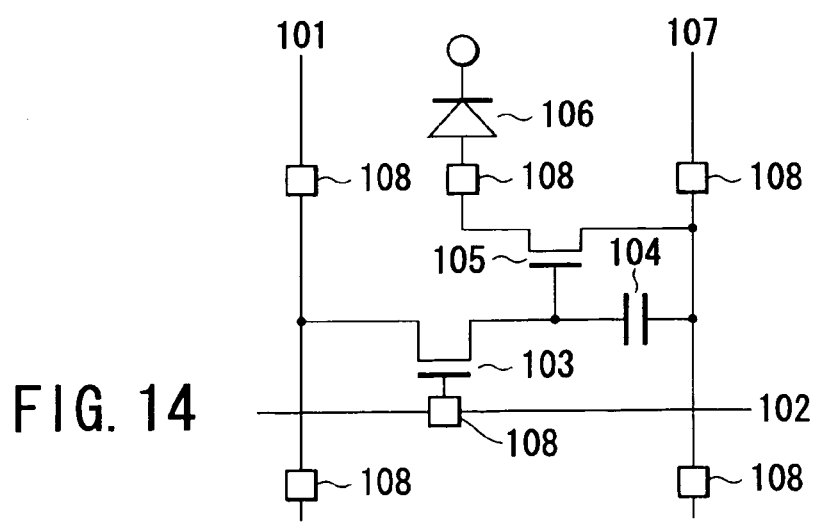
FIG. 14 is a circuit diagram of one pixel in an organic EL display according to a second embodiment.
Figure 15:
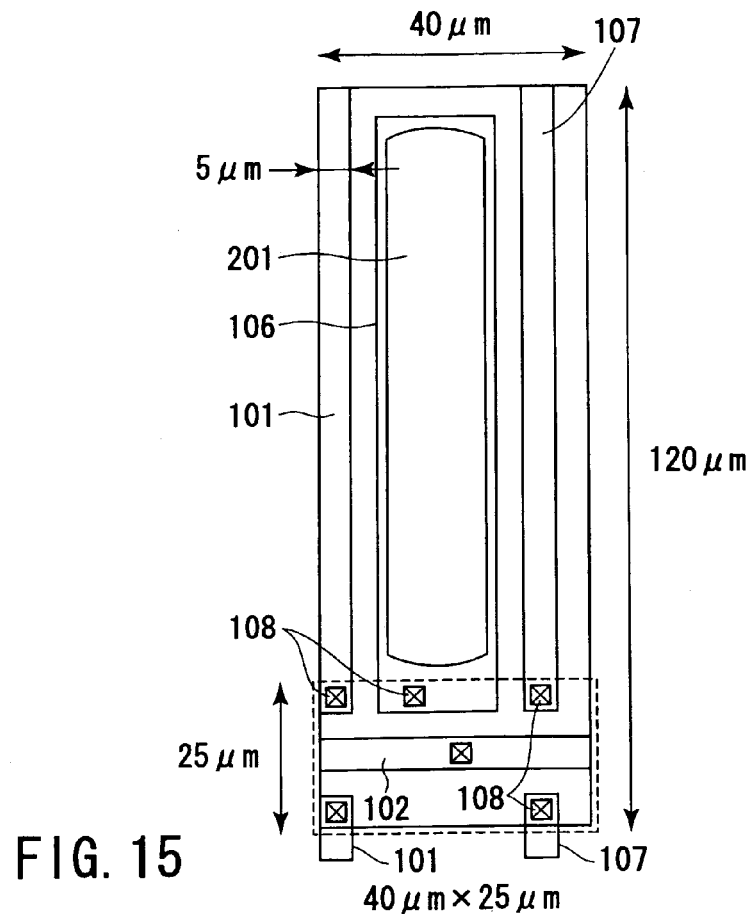
FIG. 15 is a plan view of one pixel in the organic EL display according to the second embodiment.
Figure 17:
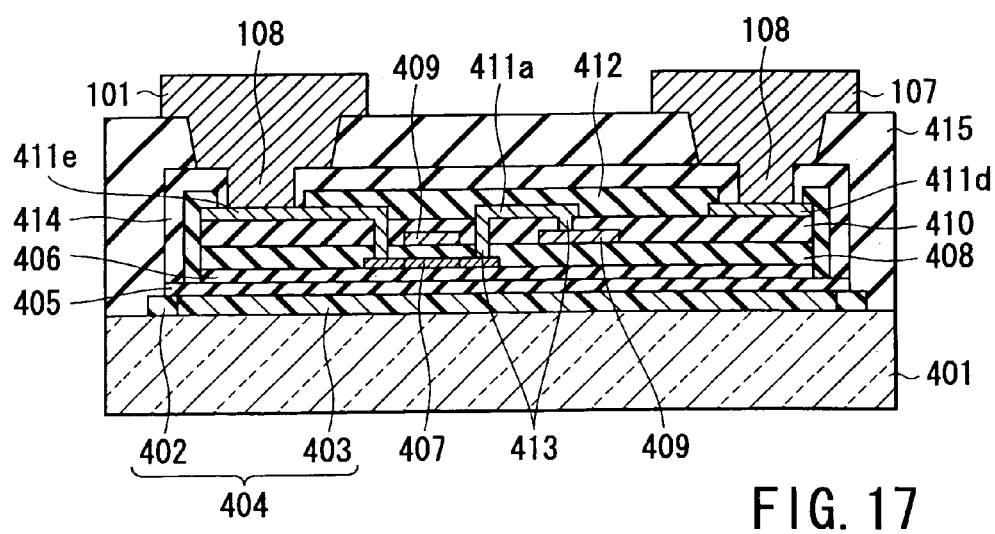
FIG. 17 is a sectional view taken along line 17-17 of FIG. 16.
Figure 16:
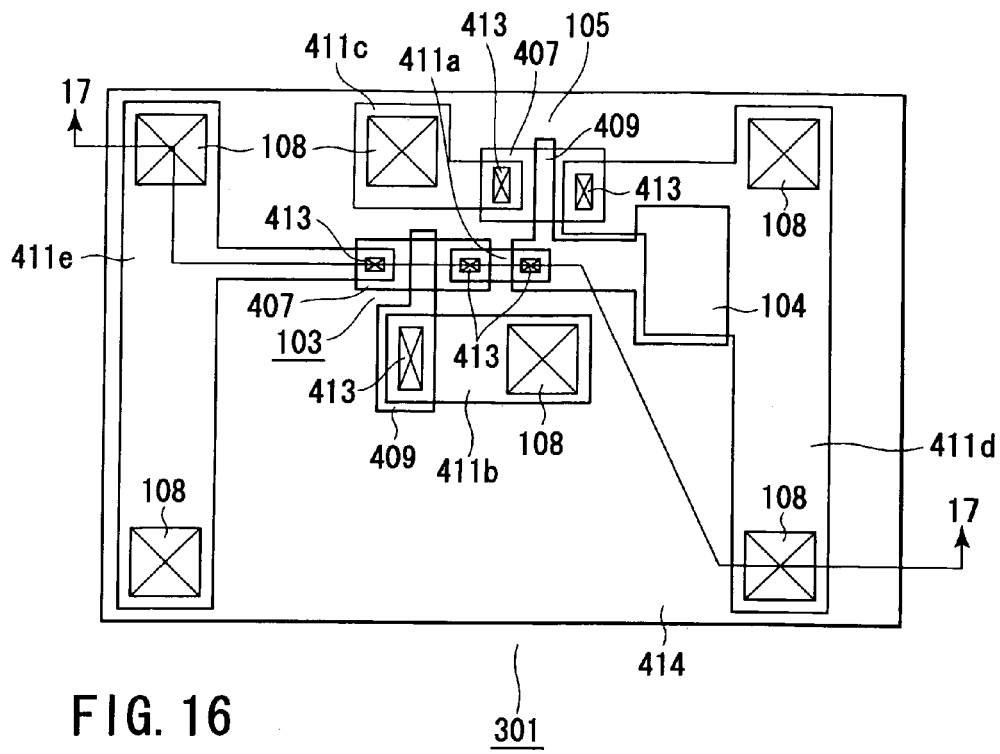
FIG. 16 is a plan view of the active element for one pixel in the organic EL display according to the second embodiment.

FIG. 14 is a circuit diagram of a single pixel in the EL display. FIG. 15 is a plan view of a pixel. FIG. 16 is a plan view of an element in one pixel (the part enclosed by a dotted line in the figure) in the single pixel. FIG. 17 is a sectional view taken along line 17-17 of FIG. 16. The part corresponding to the element in FIG. 15 represents the upper interconnections above the element. Since the entire diagram of the EL display is such that pixels of this type are arranged in an array, it will not be given here.

First, using FIG. 14, a circuit of one pixel in the EL display of the second embodiment will be explained. One pixel in the EL display of the second embodiment comprises a signal line 101, a scanning line 102, a scanning TFT 103, a storage capacitor 104, a driving TFT 105, an organic EL section 106, and a power supply line 107. Terminals 108 in FIG. 14 correspond to contact sections 108 in the FIGS. 15 and 16.

The gate of the scanning TFT 103 is connected to the scanning line 102. One of the source and drain of the TFT 103 is connected to the signal line 101 and the other is connected to one electrode of the storage capacitor 104 and to the gate of the driving TFT 105. The other electrode of the storage capacitor 104 is connected to the power supply line 107. One of the source and drain of the driving TFT 105 is connected to the power supply line 107 and the other is connected to the organic EL section 106.

With this pixel, to cause the organic EL section 106 to emit light, a pulse on the scanning line 102 turns on the scanning TFT 103 with a specific timing, thereby applying the image signal from the signal line 101 via the scanning TFT 103 to the gate of the driving TFT 105. The storage capacitor 104 intervenes between the gate of the driving TFT 105 and the power supply line 107. Therefore, charges are prevented from escaping even after the scanning line goes low and therefore the signal line 101 is separated from the driving transistor 105. As a result, according to the image signal written in the driving transistor 105, the current from the power supply line 107 is supplied to the organic EL section 106, causing the organic EL section 106 to emit light with a specific luminance.

A configuration realizing the circuit of FIG. 14 will be explained by reference to FIGS. 15 to 17.

As shown in FIG. 17, an adhesion part 404 which includes a height control member 402 and an adhesive 403 enclosed by the height control member 402 is provided on the final substrate 401. On the adhesion part 404, an under layer 405 and a buffer layer 406 are stacked.

On the buffer layer 406, a semiconductor layer 407 of the scanning TFT 103 and driving TFT 105 is provided in a specific position. On the entire surface of the resulting structure, a gate insulating layer 408 is provided. On the gate insulating layer 408, a gate electrode 409 is provided in an area corresponding to the semiconductor layer 407 of the scanning TFT 103 and driving TFT 105. The gate electrode 409 of the driving TFT 105 extends to the storage capacitor 104 as shown in FIG. 16 and also serves as the lower electrode of the storage capacitor 104.

On the entire surface of the gate electrode 409, an interlayer insulating layer 410 is provided. In the parts corresponding to the source and drain regions of the semiconductor layer 407 of the scanning TFT 103 and driving TFT 105, in-element contact sections 413 are provided in such a manner that they go through the gate insulating layer 408 and interlayer insulating layer 410. Furthermore, in the parts corresponding to the gate electrodes 409 of the scanning TFT 103 and driving TFT 105, the in-element contact sections 413 are provided in such a manner that they go through the interlayer insulating layer 410.

Then, via the in-element contact sections 413, there is provided an in-element wire 411a which connects one of the source and drain regions of the scanning TFT 103 to the gate electrode 409 of the driving TFT 105. Furthermore, via the in-element contact section 413, there are provided an in-element wire 411b that connects the gate electrode 409 of the scanning TFT 103 to the scanning line 102, an in-element wire 411c that connects one of the source and drain regions of the driving TFT 105 to the pixel electrode 201, an in-element wire 411d that connects the other of the source and drain regions of the driving TFT 105 to the power supply line 107, and an in-element wire 411e that connects the other of the source and drain regions of the scanning TFT 103 to the signal line 101. The in-element wire 411d also serves as the upper electrode of the storage capacitor 104.

A passivation layer 412 is provided on the in-element wires 411a to 411e so as to cover all the elements above the buffer layer 406. In the passivation layer 412 corresponding to a specific area of each in-element wire 411b to 411e, a contact hole of the contact section 108 is made.

On the passivation layer 412, a protective layer 414 is provided so as to cover not only the top but also the side of the layer 412. In the area where the contact sections have been provided, the protective layer 414 is also patterned to make openings for the contact sections 108.

Next, using FIGS. 15 to 17, the region above the element 301 and the region excluding the element 301 in a single pixel will be explained.

A post-transfer insulating layer 415 is provided directly on the protective layer 414 of the element 301 and on the final substrate 401 in the region excluding the element 301 in the single pixel. In the post-transfer insulating layer 415 in the regions corresponding to the specific regions of the in-element wires 411b, 411c, 411d, and 411e, contact holes for the contact sections 108 are made respectively. Then, on the post-transfer insulating layer 415, the scanning line 102 that connects to the in-element wire 411b, the pixel electrode 201 that connects to the in-element wire 411c, the power supply line 107 that connects the in-element wire 411d, and the signal line 101 that connects to the in-element wire 411e are provided via these contact sections 108. On the pixel electrode 201, the organic EL section 106 is provided. The organic EL section 106 is constructed by stacking a hole injection layer, a light-emitting layer, and a cathode one on top of another in this order.

Next, a method of manufacturing EL displays with the above-described configuration according to the second embodiment will be explained.

In the EL display manufacturing method of the second embodiment, elements 301 as shown in FIGS. 16 and 17 are formed on an element formation substrate. Then, they are transferred to an intermediate substrate and further to a final substrate. Thereafter, interconnections are formed.

An alkali-free glass substrate is used as the element formation substrate (not shown). On the entire surface of the element formation substrate, an under layer (etching stopper layer) 405 that makes element separation easy is formed. A material having hydrofluoric acid resistance, such as aluminum (AlOx), TaOx, SiNx, Si, etc. of about 1 to 2 µm is used for the under layer 405. Then, on the entire surface of the under layer 405, a layer of SiNx, SiOx, etc. is formed to a thickness of about 200 nm to 2 µm as the buffer layer 406.

On the entire surface of the buffer layer 406, an amorphous silicon semiconductor layer 407 is deposited to a thickness of about 50 nm by CVD techniques. The amorphous silicon semiconductor layer 407 is heated rapidly and crystallized, thereby forming a polycrystalline silicon layer 407. The polycrystalline silicon layer 407 is so processed by photolithography that it takes the form of islands, thereby forming a semiconductor layer 407 of a scanning TFT 103 and a driving TFT 105.

Next, an $SiO_2$ layer is formed as a gate insulating layer 408 on the entire surface by CVD techniques to a thickness of about 150 nm. On the gate insulating layer 408, MoW is sputtered to form a layer about 400 nm thick. The MoW layer is processed by photo-lithography, thereby forming the gate electrodes 409 of the scanning TFT 103 and driving TFT 105. The gate electrode 409 of the driving TFT 105 also serves as the lower electrode of the storage capacitor 104.

With the gate electrode 409 as a mask, doping is done by implanting impurity ions or by an ion shower, thereby forming the source and drain regions of the scanning TFT 103 and driving TFT 105. In forming the source and drain regions, LDD (Lightly Doped Drain) regions may be formed. In forming the LDD regions, after a mask that covers the LDD regions with resist is provided and impurity ions are implanted with a high dose, the resist is removed and then impurity ions are implanted with a low dose.

Since in the second embodiment, both of the scanning TFT 103 and driving TFT 105 may be composed of n-type TFTs, phosphorus is doped in the source and drain regions so as to achieve about $10^{20}$ $cm^{-3}$. These TFTs may be realized by p-type TFTs or a CMOS structure. In the case of CMOS, n-type and p-type impurities, such as phosphorus and boron, are doped in sequence. When one type of impurity is doped, the TFTs not to be doped are covered.

Next, an $SiO_2$ layer is formed by plasma CVD techniques to a thickness of about 400 nm, which produces an interlayer insulating layer 410. Openings are made by photolithography in specific areas of the gate insulating layer 408 and interlayer insulating layer 410 corresponding to the source and drain regions of the semiconductor layer 407 of the scanning TFT 103 and driving TFT 105, thereby making contact holes for the in-element contact sections 413.

Furthermore, openings are made by photolithography in specific areas of the interlayer insulating layer 410 corresponding to the gate electrodes 409 of scanning TFT 103 and driving TFT 105, thereby making contact holes for the in-element contact sections 413.

Next, an Al alloy, such as Al—Zr, is deposited by sputtering techniques to a thickness of about 500 to 800 nm. The resulting layer is patterned by photolithography, thereby forming in-element wires 411a to 411e.

Since the in-element wires 411a to 411e are to be connected to other electrodes at the contact section 108 later, if they keep having the Al-alloy surface, an oxide layer appears, which might increase the contact resistance. Therefore, an Mo layer may be formed on the Al alloy to make oxidation less likely or give conductivity to the wires even after they are oxidized.

It is desirable that the areas of the in-element wires 411 to make the contact sections 108 should be improved in chemical resistance. To achieve this, it is desirable that at least the areas to make the contact sections 108 should be made of refractory metal, such as MO, W, or Ta, a noble metal, such as Pt or Au, a metal, such as Cu or Ni, or an alloy of Cu or Ni.

The in-element wire 411a connects one of the source and drain regions of the scanning TFT 103 to the gate electrode 409 of the driving TFT 105 via the in-element contact section 413. The gate electrode 409 of the scanning TFT 103 is connected to the scanning line 102 via the in-element contact section 413. One of the source and drain regions of the driving TFT 105 is connected to the pixel electrode 201 via the in-element contact section 413. The other of the source and drain regions of the driving TFT 105 is connected to the power supply line 107 via the in-element contact section 413. The other of the source and drain regions of the scanning TFT 103 is connected to the signal line 101. The scanning line 102, pixel electrode 201 (not shown), power supply line 107, and signal line 101 are formed above the in-element wires 411a to 411e. A method of forming them will be explained later.

Next, to separate the individual elements on the element formation substrate into island-like pieces, the interlayer insulating layer 410, gate insulating layer 408, and buffer layer 406 in the periphery of each element are patterned by RIE techniques or the like.

A passivation layer 412 is formed using SiNx by CVD (Chemical Vapor Deposition) techniques in such a manner that the layer 412 covers each of the separated elements. The region of the passivation layer 412 corresponding to the contact section 108 and the peripheral region of each element 301 are removed. Then, a protective layer 414 is formed using the same AlOx as that of the under layer 405 in such a manner that the layer 414 further covers the regions covered with the passivation layer 412. The regions of the protective layer 414 corresponding to the contact sections 108 and the peripheral region of each element 301 are removed.

In the second embodiment, the passivation layer 412 is formed using SiNx whose water permeability is low. In addition, the under layer 405 and protective layer 414 are so formed using AlOx that they cover all the elements. With this configuration, damage to the elements in the transfer process is reduced, the curving of the elements is prevented owing to stress relaxation, contamination from outside the elements including the adhesive is prevented, and the reliability of the elements in terms of water resistance is improved.

The protective layer 414 and passivation layer 412 may be made of the same material, which enables the protective layer 414 to also serve as a passivation layer. In that case, to produce the above effect, a stacked layer of AlOx and SiNx, or AlSiNxOy and TaOx, or the like may be used.

In the method of making the opening sections 108 in the passivation layer 412 and protective layer 414, a post-transfer insulating layer may be formed after the process of transferring the elements to the final substrate explained later and thereafter these three layers may be patterned simultaneously. In this case, although a protective layer cannot be formed so as to cover the passivation layer on the sides of the elements, the adverse effect can be minimized by making suitable modifications to the process of taking the elements out of the element formation substrate.

Furthermore, after the passivation layer 412 is formed, a protective layer 414 may be formed without separating the elements and thereafter the elements may be separated. In that case, to increase the reliability, it is desirable that the scanning TFT 103 and driving TFT 105 should be separated about 5 to 10 μm away from the end in separating the elements. When the elements are separated, the under layer 405 may not be separated.

Since the process of transferring the elements thus formed on the element formation substrate to the intermediate substrate and further to the final substrate on which the height control members and the adhesive surrounded by the height control members have been formed is carried out by the method described in the first embodiment, an explanation of the process will be omitted.

Next, as shown in FIG. 17, on the entire surface of the final substrate 401 to which the elements 301 have been transferred, a post-transfer insulating layer 415 is formed using photosensitive acrylic resin. The post-transfer insulating layer 415 corresponding to the contact sections 108 of the elements 301 is removed, thereby forming opening sections.

Next, as shown in FIG. 15, Al, ITO, or the like is formed on the entire surface by sputtering techniques or the like. The resulting layer is patterned by photolithography or the like, thereby forming a signal line 101, a scanning line 102, a power supply line 107, and a pixel electrode 201.

Thereafter, as shown in FIG. 15, an organic EL section 106 is provided on the pixel electrode 201. The resulting structure is laminated with a cover substrate and sealed. Then, wiring is done (not shown), which completes an EL display.

Furthermore, an opposite substrate on which transparent electrodes and others have been formed may be caused to face the final substrate on which the elements have been formed. Then, liquid crystal is injected between them. Then, the resulting structure is sealed and wired, which completes the liquid-crystal display.

In the second embodiment, such elements are transferred to the final substrate on which the height control members and the adhesive have been formed, thereby forming an EL display with the height-controlled elements. Since the height of the elements has been controlled, there is no variation in the capacitances developed between the wires and the elements, which assures a high display quality.

Furthermore, in the second embodiment, since the size of one pixel is set to about 40 μm×about 120 μm and the size of one element is set to about 40 μm×about 25 μm, as shown in FIG. 15, the size of the element is about ⅕ of that of a pixel. The manufacture of elements requires many processing steps. In the second embodiment, elements are formed with high density using a special element formation substrate and then transferred. Therefore, when the element formation substrate is as large as the final substrate, as many elements as there are on four or more final substrates can be formed on a single element formation substrate. Since elements requiring many manufacturing processes can be formed at a time, this helps reduce the cost, which is desirable.

In the second embodiment, each element is provided on the under layer which has been separated element by element. The under layer mitigates strain in the lower part of the element, which increases reliability. The mitigation of strain prevents the characteristics of the elements from changing and further avoids detachment failure, which helps improve the reliability of adhesion during transfer.

Furthermore, while in the second embodiment, photosensitive acrylic resin has been used as the height control members of the adhesion part, the height control members are not limited to this material and may be another solid material, provided that it can maintain the height of the adhesion part. For instance, since the following materials can control the height of the adhesion part, they are desirable materials for the height control members: photosensitive resin, such as polyimide, BCB (benzocyclo-butene) or, fluoric resin, nonphotosensitive resin, such as PET (polyethylene telephtalate), PES (polyether sulfone), or PEN (polyethylene naphtalate), which is used as a substrate, or a processing material for embossing a substrate or injection-molding a substrate, and inorganic insulating layers, such as an SiOx layer formed by calcining a coating-type SOG (Spin On Glass) or a layer of polysilazane, SiOx, SiNx, or phosphorous glass formed by CVD techniques.

While in the embodiment, ultraviolet-curing adhesive has been used as the adhesive of the adhesion part, the adhesive is not restricted to this and may be another adhesive, provided that it adheres to the elements when the active matrix substrate is completed. For instance, since thermosetting adhesive, thermoplastic adhesive, elastic adhesive, and alloy adhesive adhere well to the elements, they are desirable materials.

Materials for these adhesives include, for instance, one-part epoxy resin, two-part epoxy resin, acrylic resin, melamine resin, polyimide resin, polyester resin, polybenzimidazole resin, phenolic resin, urea resin, resorcinol resin, cellulose acetate resin, nitrocellulose resin, polyvinyl acetate resin, polyvinyliden chloride resin, polyamide, cyanoacrylate, polyurethane rubber, silicone rubber, and acrylic emulsion.

These adhesives may be liquid when being formed and hardened later. They may be applied by a method of dropping a specific amount from a nozzle or ink-jet. To drop adhesive, a mechanical pump or a piezoelectric device may be used for dispensing adhesive or propelling drops of adhesive through the air. Moreover, a solid adhesive may be segmented into small pieces at the time of the formation of adhesive. The small pieces are arranged mechanically or attracted by electrostatic force for arrangement. Since the adhesive does not control the height, it may be a solid that has plasticity or elasticity.

While in the second embodiment, a glass substrate has been used as the final substrate, a plastic substrate, resin film, ceramic substrate, thin metal sheet substrate, or the like may be used as the final substrate. Previously, although a plastic substrate, resin film, or the like was light, they could not be formed accurately into a high-precision active matrix substrate because the thermal deformation and thermal expansion coefficient were large. In the second embodiment, however, the formation of elements including heating processes is carried out on the element formation substrate and the resulting elements are transferred. This enables lightweight substrates to be selected, regardless of the material of the final substrate.

Figure 18:
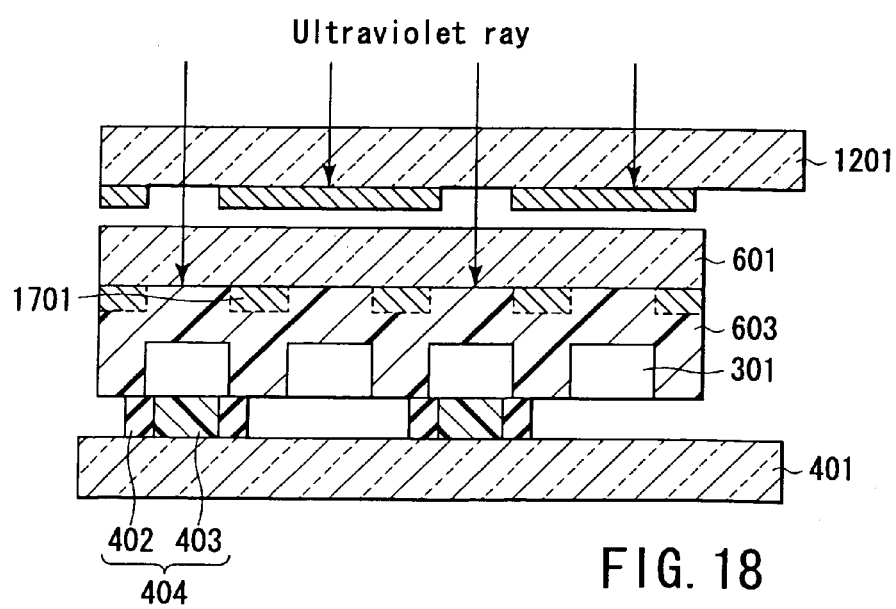
FIG. 18 is a sectional view to help explain a modification of the adhesion process for the intermediate substrate and the final substrate (see FIG. 9) in the first or second embodiment.

Next, FIG. 18 shows a modification of the process of transferring the elements from the intermediate substrate to the final substrate in the first or second embodiment. In FIG. 18, the same parts as those in the first embodiment are indicated by the same reference numerals and an explanation of them will be omitted.

In this modification, as shown in FIG. 18, an on-intermediate-substrate mask 1701 is further provided in such a manner that it is in contact with the intermediate substrate 601. When the intermediate substrate 601 is thick, if light is projected only through a glass mask 1201, the light might be projected onto the unselected elements 301. Providing the on-intermediate-substrate mask 1701 makes the boundary of the light projecting area clear, which improves the selectivity of the elements 301 to be transferred.

In the case of this modification, even if an optical conversion material is not provided, the selectivity is improved. Therefore, this is particularly effective in using a temporary adhesion layer 603 whose adhesion decreases due to ultraviolet rays or when unable to find a suitable material for an optical conversion material. This modification is also effective when the elements 301 to be transferred are as small as about 20 to 40 μm, because the temporary adhesion layer 603 can be peeled with a high space precision.

In this modification, too, since the adhesion part 404 selectively bonds only one element 301 to the adhesive 301 and height control member 402, the element 301 is bonded to the adhesion part 404 and peeled from the temporary layer 603, which assures a comprehensive selectivity.

Either the glass mask 1201 or on-intermediate-substrate mask 1701 may be omitted and a laser beam may be used. Then, the laser beam is projected onto only the elements 301 to be transferred.

Next, examples of the shape of the adhesion part formed on the final substrate differing from that in the first (or second) embodiment will be explained in a third to a ninth embodiment of the present invention. In these embodiments, because the parts excluding the adhesion parts are formed as in the first embodiment, an explanation of the parts excluding the adhesion parts will be omitted.

Third Embodiment

Figure 19A:
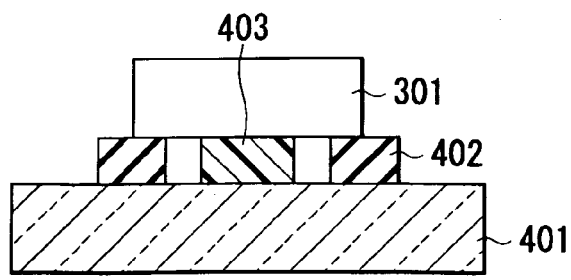
FIGS. 19A and 19B are a sectional view and a plan view to help explain the way an adhesion part and an active element are laid one on top of the other in the process of manufacturing active matrix substrates according to a third embodiment.
Figure 19B:
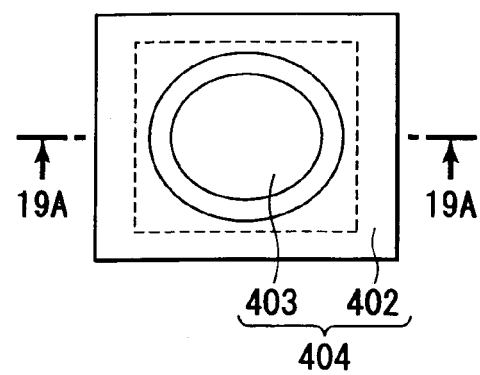

FIG. 19A is a sectional view of an element in an active matrix substrate according to a third embodiment of the present invention. FIG. 19B is a plan view of an adhesion part corresponding to one element. As shown in FIG. 19B, the third embodiment has the same configuration as the first embodiment except that the inside of the height control member 402 of the adhesion part 404 takes the form of a circle. The broken line in FIG. 19B shows the outside of the element 301.

In the third embodiment, the inside of the height control member 402 is caused to have a curved surface with a specific curvature, which reduces the gap between the spread adhesive 403 and the height control member 402 when the element 301 is pressed against the adhesion part 404. When a liquid adhesive with high viscosity is used as the adhesive 403, this particularly produces a great effect, because the shape produced as a result of being pressed by the element 301 would take the form of a curved surface.

When the outside of the height control member 402 has a form similar to a regular square, it is desirable that its inside should be made circular. If the inside of the height control member 402 has a curved surface with the curvature corresponding to the shape of the outside of the height control member 402, a similar effect can be obtained. Although the radius of curvature of the inside of the height control member 402 depends on the viscosity of the material for the adhesive 403 or the like, it should be about ⅕ to ½ of the length of one side of the height control member 402. The material and the forming method for the height control member 402 are the same as in the first embodiment.

Fourth Embodiment

Figure 20A:
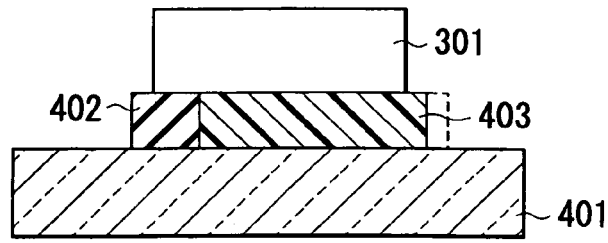
FIGS. 20A and 20B are a sectional view and a plan view to help explain the way the adhesion part and the active element are laid one on top of the other in the process of manufacturing active matrix substrates according to the fourth embodiment.
Figure 20B:
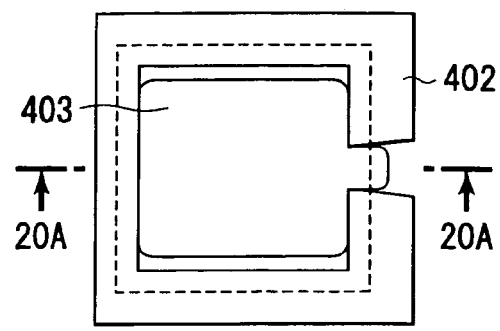
Figure 20C:
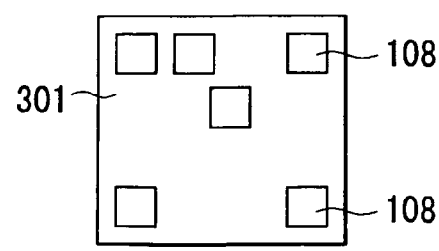
FIG. 20C is a plan view of an active element to help explain an example of the arrangement of contact sections of the active element suitable for the configuration of FIG. 20B.

FIG. 20A is a sectional view of an element formed in an active matrix substrate according to a fourth embodiment of the present invention. FIG. 20B is a plan view of an adhesion part corresponding to one element. FIG. 20C is a plan view of one element. As shown in FIG. 20B, the fourth embodiment has the same configuration as the first embodiment except that the height control member 402 of the adhesion part 404 is so formed that it has a cut 1901 in it and encloses the adhesive 403. The broken line in FIG. 20B shows the outside of the element 301.

In the fourth embodiment, since the height control member 402 is provided in such a manner that it has a cut in it and encloses the adhesive 403, even when the amount of adhesive 403 is a little too much, extra adhesive 403 flows through the cut 1901 to the outside of the height control member 402. Therefore, even if the amount of adhesive 403 is not controlled precisely, the height and spread of the adhesion part 404 can be controlled.

Furthermore, when the cut 1901 is so made that it is narrower at the part near the inside of the height control member 402 and wider at the part near the outside, the height of the adhesive that flows from the cut 1901 is less than the height of the height control member 402, which prevents the adhesion from adhesive to adjacent elements.

Moreover, when the cut 1901 is made in a different or separate position from the position corresponding to the contact section 108 of the element 301 as shown in FIG. 20C, even if the adhesive flows from the cut 1901 and extends over the element 301, the occurrence of poor contact can be reduced.

The cut 1901 may be a hole made in the sidewall of the height control member.

Fifth Embodiment

Figure 21A:
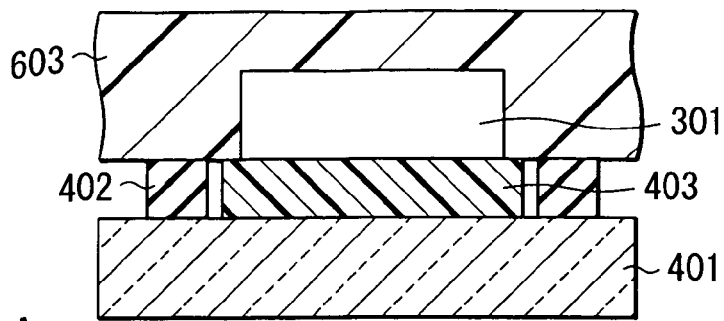
FIGS. 21A and 21B are a sectional view and a plan view to help explain the way an adhesion part and an active element are laid one on top of the other in an active matrix substrate manufacturing method according to a fifth embodiment of the present invention.
Figure 21B:
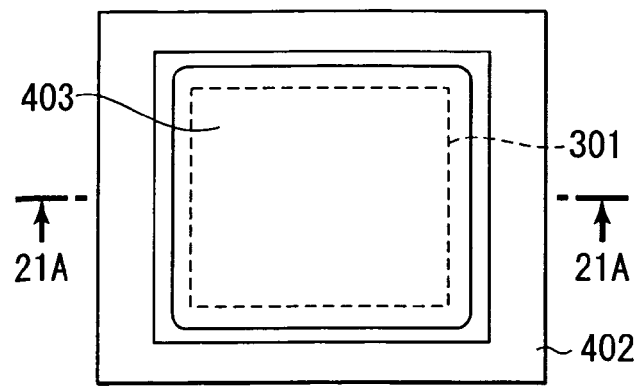

FIG. 21A is a sectional view of an element formed in an active matrix substrate according to a fifth embodiment of the present invention. FIG. 21B is a plan view of an adhesion part corresponding to one element. The area shown by a broken line in FIG. 21B is the position corresponding to an element 301. As shown in FIG. 21B, the fifth embodiment has the same configuration as the first embodiment except that the element 301 is provided inside the height control member 402 of the adhesion part 404.

In the fifth embodiment, when the elements 301 are transferred from the intermediate substrate to the final substrate, the temporary adhesion layer around the element 301 comes in contact with the height control member 402 to prevent the element from being pressed any further (FIG. 21), which keeps the height of the adhesion part 404 constant as in the first embodiment and enables the element to be transferred in such a manner that the element is almost parallel to the surface of the final substrate. Furthermore, since the height can be controlled, the adhesive 403 can be prevented from spreading. In the fifth embodiment, providing the element 301 inside the height control member 402 increases the contact area of the element 301 and adhesive 403, resulting in an increase in adhesion.

The fifth embodiment cannot be applied to a case where the transfer of the element to the immediate substrate 601 is carried out by bonding the element to the adhesion layer 603a as shown in FIG. 3D, because the element 301 is not buried in the temporary adhesion layer in such a manner that the element is flush with the surface.

Sixth Embodiment

Figure 22A:
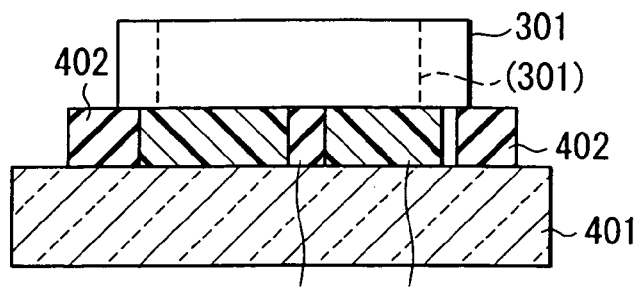
FIGS. 22A and 22B are a sectional view and a plan view which help explain the way an adhesion part and an active element are laid one on top of the other in an active matrix substrate manufacturing method according to a sixth embodiment and which illustrate an example of further providing a plurality of parallel height control members under the active element.
Figure 22B:
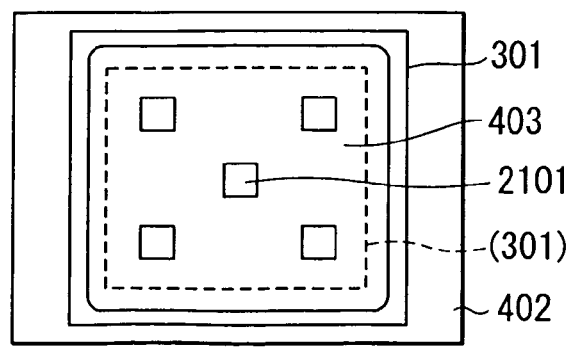

FIG. 22A is a sectional view of an element formed in an active matrix substrate according to a sixth embodiment of the present invention. FIG. 22B is a plan view of an adhesion part corresponding to one element. As shown in FIG. 22B, the sixth embodiment has the same configuration as the first embodiment except that not only is the height control member 402 of the adhesion part 404 so provided that it encloses the adhesive 403, but also a second height control member 2101 is provided under the element 301 region.

In the sixth embodiment, the second height control member 2101 is formed by photolithography using photosensitive acrylic resin, such as OPTMER from JSR Corporation, epoxy resin, or novolac resin. The height control member 402 and second height control member 3101 may be formed simultaneously. For instance, photosensitive acrylic resin is formed on the entire surface. Then, with a photo mask corresponding to the height control member 402 and second height control member 2101, exposure and development are carried out, thereby producing two control members with the same height.

In the sixth embodiment, providing the second height control member 2101 also under the region corresponding to the element 301 enables the height of the element 301 to be controlled precisely. This feature is particularly effective in making the element 301 smaller than the inner circumference of the height control member, as shown by dotted lines in FIGS. 22A and 22B. It is desirable that the total cross-sectional area of the second height control member 2101 provided under the element 301 region should be about 0.1 to 0.8 times the area of the element 301. When the element 301 has a low strength against deformation, it is desirable that the area of the second height control member 2101 should be as large as possible in order to reduce damage to the element. Particularly when the area to be transferred at a time is large and the pressure at which the intermediate substrate 601 and final substrate 401 are pressed varies from place to place, it is desirable that the area should be about 0.5 or more times the area of the element 301 to reduce damage to the element 301.

Seventh Embodiment

Figure 23A:
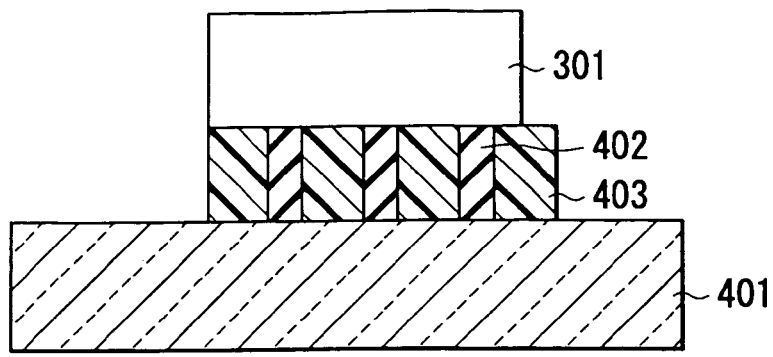
FIGS. 23A and 23B are a sectional view and a plan view which help explain the way an adhesion part and an active element are laid one on top of the other in an active matrix substrate manufacturing method according to a seventh embodiment and which correspond to an example of eliminating the cylindrical height control members from the sixth embodiment.
Figure 23B:
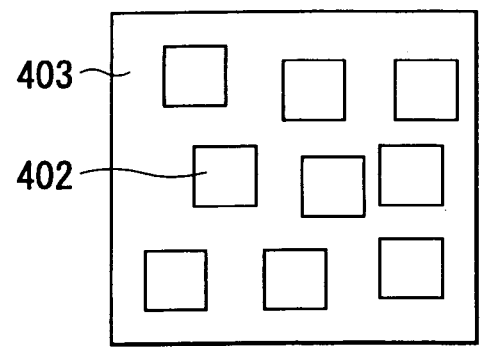

FIG. 23A is a sectional view of an element formed in an active matrix substrate according to a seventh embodiment of the present invention. FIG. 23B is a plan view of an adhesion part corresponding to one element. As shown in FIG. 23B, the seventh embodiment has the same configuration as the first embodiment except that the height control member 402 of the adhesion part 404 is not provided so as to surround the adhesive 403 and the adhesive 403 surrounds the height control member 402.

In the seventh embodiment, a plurality of small height control members 402 are formed by patterning so as to stand side by side. As for the adhesive 403, a material capable of keeping its shape at the time of formation is formed into a specific shape by printing or the like. It is desirable that the outward shape of the adhesive 403 should be similar to that of the element 301.

In the seventh embodiment, although the height control member 402 is not provided so as to surround the adhesive 403, use of the height control member 402 keeps the height constant even when the element 301 is pressed as explained in the other embodiments.

Since the adhesive 403 itself keeps its shape and the height control member 402 restrains the element 301 from being pressed, the adhesive 403 is prevented from spreading. A material capable of being formed by printing or the like and keeping its shape by itself includes a liquid-crystal main seal adhesive where thickening agent or the like is mixed, such as printing ink, ultraviolet-curing epoxy resin, thermosetting epoxy resin, and acrylic resin.

Eight Embodiment

Figure 24A:
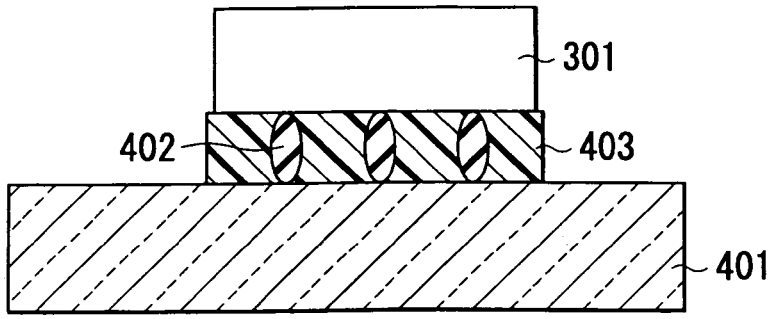
FIGS. 24A and 24B are a sectional view and a plan view which help explain the way an adhesion part and an active element are laid one on top of the other in an active matrix substrate manufacturing method according to an eighth embodiment and which illustrate an example of distributing height control members in an adhesive.
Figure 24B:
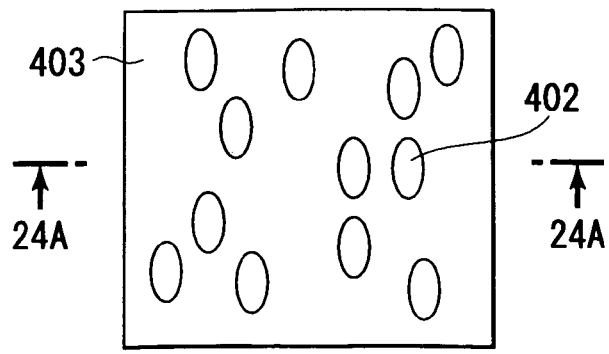

FIG. 24A is a sectional view of an element formed in an active matrix substrate according to an eighth embodiment of the present invention. FIG. 24B is a plan view of an adhesion part corresponding to one element. As shown in FIG. 24B, the eighth embodiment has the same configuration as the first embodiment except that the height control members 402 of the adhesion part 404 are not provided so as to surround the adhesive 403 and the height control members 402 are distributed in the adhesive 403.

In the eighth embodiment, the adhesion part 404 is formed by printing in such a manner that the height control members 402 are distributed in the adhesive 403. As for the height control members 402, silica, SiNx, polyester, polyethylene, acrylic resin, or the like is formed into pillar-like pieces, sphere-like pieces, fiber-like pieces, bead-like pieces, or pieces of another shape. Then, these pieces are distributed in the adhesive 403 singly or in a mixed manner.

In the eighth embodiment, too, use of the height control members 402 makes the height of the element 301 constant even when the element 301 is pressed and prevents the adhesive 403 from spreading as in the other embodiments. Furthermore, since the eighth embodiment does not include the process of forming the height control members 402, it has the effect of decreasing the number of active matrix manufacturing steps.

Ninth Embodiment

Figure 25A:
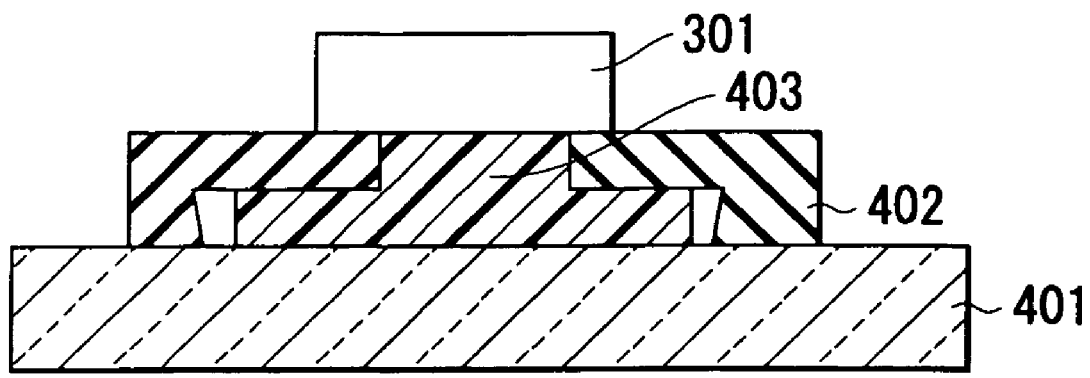
FIGS. 25A and 25B are a sectional view and a plan view which help explain the way an adhesion part and an active element are laid one on top of the other in an active matrix substrate manufacturing method according to a ninth embodiment of the present invention.
Figure 25B:
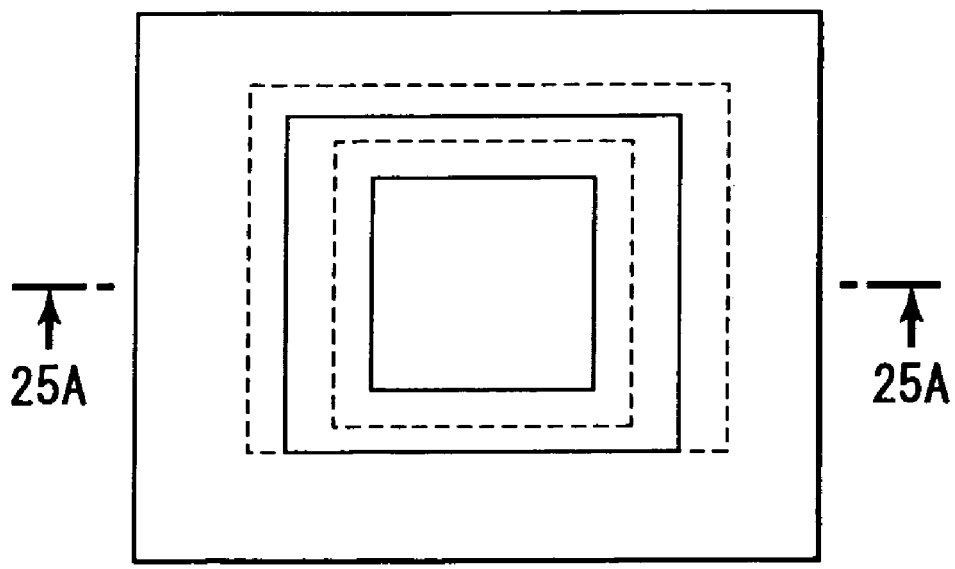

FIG. 25A is a sectional view of an element formed in an active matrix substrate according to a ninth embodiment of the present invention. FIG. 25B is a plan view of an adhesion part corresponding to one element. As shown in FIG. 25B, the ninth embodiment has the same configuration as the first embodiment except that the height control member 402 of the adhesion part 404 surrounds not only the adhesive 403 but also a part of the top of the adhesive 403. In FIG. 25B, the broken line indicates the outside of the element 301.

In the ninth embodiment, an adhesive 403 is first formed by printing or the like. Then, a height control member 402 previously formed using plastic is bonded to the final substrate 401. Thereafter, as in the other embodiments, the element 301 is pressed against the height control member 402, thereby bonding the element 301 to the adhesive 403 sticking out from the top surface of the height control member 402.

In the ninth embodiment, even when the element 301 is pressed, the height of the element 301 is kept constant and the adhesive 403 is prevented from spreading as in the other embodiments. Furthermore, in the ninth embodiment, since the sides and part of the adhesive 403 are covered with the height control member 402, a much greater margin can be left in the adhesive applying process, which helps improve the yield in bonding the elements 301.

In addition, the above embodiments may be combined suitably.

As has been described above, with the present invention, it is possible to provide an active matrix substrate which is capable of controlling the height of active elements from the surface of the final substrate in transferring the active elements and enables the active elements to be almost parallel to the final substrate even via an adhesion part. It is further possible to provide a method of manufacturing such active matrix substrates.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing an active matrix substrate, comprising:
    forming a plurality of active elements on a first substrate;
    forming a plurality of adhesion parts on a second substrate, each of the adhesion parts including an adhesive and a height control member surrounding the adhesive;
    selectively transferring said plurality of active elements to said second substrate in such a manner that said plurality of active elements adhere to said adhesion parts;
    forming interconnections between said plurality of active elements transferred onto said second substrate; and
    transferring said plurality of active elements to a third substrate via a temporary adhesive layer between said forming a plurality of active elements on a first substrate and said selectively transferring said plurality of active elements to said second substrate, wherein
    said selectively transferring said plurality of active elements to said second substrate includes decreasing adhesion of said temporary adhesive layer on said third substrate which bonds said selected active elements.

2. The method according to 1, wherein said forming a plurality of adhesion parts, each including a height control member, includes forming said height control member in such a manner that at least one cut or one hole is made in a wall surface of said height control member.

3. The method according to 1, wherein said selectively transferring said plurality of active elements to said second substrate includes placing said selected active elements on said adhesive and said height control members.

4. The method according to 1, wherein said selectively transferring said plurality of active elements to said second substrate includes arranging said selected active elements inside said height control members to place on said adhesive.

5. A method of manufacturing an active matrix substrate, comprising:
    forming a plurality of active elements on a first substrate;
    forming a plurality of adhesion parts on a second substrate, each of said plurality of adhesion parts including a plurality of height control members in an adhesive;
    selectively transferring said plurality of active elements to said second substrate in such a manner that said plurality of active elements adhere to said plurality of adhesion parts;
    forming interconnections between said plurality of active elements transferred onto said second substrate; and
    transferring said plurality of active elements to a third substrate via a temporary adhesive layer between said forming a plurality of active elements on a first substrate and said selectively transferring said plurality of active elements to said second substrate, wherein
    said selectively transferring said plurality of active elements to said second substrate includes decreasing adhesion of at least a part of said temporary adhesive layer on said third substrate which bonds said selected active elements.

6. The method according to 5, wherein said forming a plurality of adhesion parts, each including a plurality of height control members in adhesive, includes distributing sphere-like, pillar-like, or fiber-like members in said adhesive as said height control members.

7. The method according to 5, wherein said forming a plurality of adhesion parts, each including a plurality of height control members, includes standing a plurality of pillar-like members side by side in said adhesive as said height control members.

8. The method according to 7, wherein said standing a plurality of pillar-like members side by side in said adhesive includes forming a height control member so as to surround said adhesive and said plurality of pillar-like members.

* * * * *